(12) United States Patent
Sato et al.

(10) Patent No.: US 10,272,537 B2
(45) Date of Patent: Apr. 30, 2019

(54) METHOD FOR POLISHING GAN SINGLE CRYSTAL MATERIAL

(71) Applicant: NORITAKE CO., LIMITED, Nagoya-shi, Aichi (JP)

(72) Inventors: Makoto Sato, Nagoya (JP); Wataru Omori, Nagoya (JP); Maiko Takahashi, Nagoya (JP)

(73) Assignee: NORITAKE CO., LIMITED, Nagoya (JP)

( * ) Notice: Subject to any disclaimer, the term of this patent is extended or adjusted under 35 U.S.C. 154(b) by 0 days.

(21) Appl. No.: 15/128,626

(22) PCT Filed: Mar. 26, 2015

(86) PCT No.: PCT/JP2015/059526
§ 371 (c)(1),
(2) Date: Sep. 23, 2016

(87) PCT Pub. No.: WO2015/152021
PCT Pub. Date: Oct. 8, 2015

(65) Prior Publication Data
US 2017/0100815 A1    Apr. 13, 2017

(30) Foreign Application Priority Data

Mar. 31, 2014   (JP) ................. 2014-074202

(51) Int. Cl.
*H01L 37/00*  (2006.01)
*B24B 37/04*  (2012.01)
(Continued)

(52) U.S. Cl.
CPC ............ *B24B 37/044* (2013.01); *B24B 7/228* (2013.01); *C08L 63/00* (2013.01); *C08L 81/06* (2013.01);
(Continued)

(58) Field of Classification Search
CPC ..... B24B 7/228; B24B 37/042; B24B 37/044; B24B 37/24; B24B 37/245; B24D 3/32;
(Continued)

(56) References Cited

U.S. PATENT DOCUMENTS 7,416,604 B2 *  8/2008  Ishibashi ............... C30B 29/403
                                                           117/102
2005/0150172 A1  7/2005  Sato
(Continued)

FOREIGN PATENT DOCUMENTS

CN    101066583 A    11/2007
EP    1 852 480 A1   11/2007
(Continued)

OTHER PUBLICATIONS

Oct. 4, 2016 Written Opinion issued in International Patent Application No. PCT/JP2015/059526.
(Continued)

*Primary Examiner* — Timothy V Eley
(74) *Attorney, Agent, or Firm* — Oliff PLC (57) ABSTRACT

A polishing processing method using a CMP method for polishing a surface of a crystal material to be smooth by using a loose polishing abrasive grain type polishing pad in the presence of a polishing liquid and a plurality of polishing abrasive grains, in which the crystal material is a single crystal of GaN, and the polishing liquid is an oxidizing polishing liquid having an oxidation-reduction potential between Ehmin (determined by Eq. (1)) mV and Ehmax (determined by Eq. (2)) mV and pH between 0.1 and 6.5: Ehmin (mV)=−33.9 pH+750 . . . (1) Ehmax (mV)=−82.1 pH+1491 . . . (2).

9 Claims, 5 Drawing Sheets

(51) Int. Cl.
  *B24B 7/22* (2006.01)
  *C08L 63/00* (2006.01)
  *H01L 21/306* (2006.01)
  *C09G 1/02* (2006.01)
  *C09G 1/16* (2006.01)
  *H01L 21/02* (2006.01)
  *C08L 81/06* (2006.01)

(52) U.S. Cl.
  CPC ............... *C09G 1/02* (2013.01); *C09G 1/16* (2013.01); *H01L 21/02024* (2013.01); *H01L 21/30625* (2013.01)

(58) Field of Classification Search
  CPC ....... C09G 1/02; C09G 1/16; H01L 21/02013; H01L 21/02024; H01L 21/30625
  See application file for complete search history.

(56) References Cited

U.S. PATENT DOCUMENTS

| | | |
|---|---|---|
| 2007/0254401 A1 | 11/2007 | Nishiura et al. |
| 2007/0281484 A1 | 12/2007 | Ishibashi et al. |
| 2009/0317638 A1* | 12/2009 | Kawabata ............ C09K 3/1463 428/409 |
| 2010/0248478 A1 | 9/2010 | Nishiura et al. |
| 2013/0075867 A1 | 3/2013 | Nishiura et al. |
| 2013/0149945 A1* | 6/2013 | Misra .................... B24B 37/042 451/540 |
| 2013/0292802 A1* | 11/2013 | Ishibashi ............... C30B 29/403 257/615 |
| 2016/0257854 A1* | 9/2016 | Omori .................... B24B 37/00 |

FOREIGN PATENT DOCUMENTS

| | | |
|---|---|---|
| EP | 1 863 074 A2 | 12/2007 |
| EP | 2514858 A1 | 10/2012 |
| JP | 2006-179647 A | 7/2006 |
| JP | 2007-103457 A | 4/2007 |
| JP | 2007-299979 A | 11/2007 |
| JP | 2008-010835 A | 1/2008 |
| JP | 2008-068390 A | 3/2008 |
| JP | 2011-129752 A | 6/2011 |
| JP | 2012-253259 A | 12/2012 |
| WO | 2008/102672 A1 | 8/2008 |

OTHER PUBLICATIONS

May 12, 2015 Search Report issued in International Patent Application No. PCT/JP2015/059526.
May 24, 2018 extended European Search Report issued in European Application No. 15774319.6.
Jul. 17, 2018 Office Action issued in Japanese Patent Application No. 2017-215116.
Oct. 26, 2018 Office Action issued in Taiwan Patent Application No. 104110016.

* cited by examiner

| SAMPLES | LOOSE ABRASIVE GRAINS | | | | | | |
|---|---|---|---|---|---|---|---|
| | ABRASIVE GRAIN | GRAIN DIAMETER | ABRASIVE GRAIN HARDNESS | OXIDATION-REDUCTION POTENTIAL Eh mV | pH | POLISHING RATE nm/h | SURFACE ROUGHNESS Ra nm |
| 1 | ALUMINA | 280nm | 2200 | 987 | 5.10 | 150 | 0.3 |
| 2 | ALUMINA | 4μm | 2200 | 992 | 5.30 | 240 | 1.8 |
| 3 | ALUMINA | 600nm | 2200 | 720 | 8.10 | 6 | 1.3 |
| 4 | ALUMINA | 600nm | 2200 | 530 | 6.50 | 50 | 0.8 |
| 5 | ALUMINA | 600nm | 2200 | 943 | 6.30 | 60 | 0.7 |
| 6 | ALUMINA | 600nm | 2200 | 1072 | 4.90 | 260 | 0.5 |
| 7 | ALUMINA | 600nm | 2200 | 121 | 1.50 | 0 | 1.6 |
| 8 | ALUMINA | 600nm | 2200 | 723 | 0.80 | 57 | 0.6 |
| 9 | ALUMINA | 600nm | 2200 | 1406 | 0.10 | 120 | 0.9 |
| 10 | DIAMOND | 1μm | 7600 | 560 | 5.00 | 100 | 0.8 |
| 11 | DIAMOND | 1μm | 7600 | 1064 | 5.20 | 1000 | 0.4 |
| 12 | SILICA | 10nm | 680 | 1385 | 1.20 | 15 | 0.1 |
| 13 | SILICA | 250nm | 680 | 1376 | 1.40 | 22 | 0.2 |
| 14 | SILICA | 250nm | 680 | 1404 | 0.80 | 10 | 0.1 |

| | FIXED ABRASIVE GRAIN 1 | | | | | | |
|---|---|---|---|---|---|---|---|
| SAMPLES | ABRASIVE GRAIN | GRAIN DIAMETER | ABRASIVE GRAIN HARDNESS | OXIDATION-REDUCTION POTENTIAL Eh mV | pH | POLISHING RATE nm/h | SURFACE ROUGHNESS Ra nm |
| 15 | SILICA | 250nm | 680 | 570 | 6.70 | 0 | 2.1 |
| 16 | SILICA | 250nm | 680 | 620 | 5.60 | 7 | 1.9 |
| 17 | SILICA | 250nm | 680 | 870 | 5.70 | 18 | 1.5 |
| 18 | SILICA | 250nm | 680 | 942 | 6.50 | 0 | 2.0 |
| 19 | SILICA | 250nm | 680 | 703 | 1.30 | 15 | 2.3 |
| 20 | SILICA | 250nm | 680 | 1101 | 1.80 | 20 | 1.9 |
| 21 | SILICA | 250nm | 680 | 1380 | 1.20 | 80 | 1.2 |
| 22 | SILICA | 250nm | 680 | 734 | 0.16 | 23 | 2.2 |
| 23 | SILICA | 250nm | 680 | 1150 | 0.12 | 56 | 1.6 |
| 24 | SILICA | 250nm | 680 | 1412 | 0.40 | 350 | 0.2 |
| 25 | ALUMINA | 600nm | 2200 | 720 | 8.10 | 0 | 2.2 |
| 26 | ALUMINA | 600nm | 2200 | 530 | 6.50 | 6 | 2.3 |
| 27 | ALUMINA | 600nm | 2200 | 1002 | 5.70 | 120 | 0.4 |
| 28 | ALUMINA | 600nm | 2200 | 121 | 1.50 | 0 | 2.4 |
| 29 | ALUMINA | 600nm | 2200 | 1105 | 0.16 | 334 | 0.6 |
| 30 | ALUMINA | 600nm | 2200 | 1406 | 0.50 | 520 | 0.7 |

FIG.6

| | FIXED ABRASIVE GRAIN 2 | | | | | | |
|---|---|---|---|---|---|---|---|
| SAMPLES | ABRASIVE GRAIN | GRAIN DIAMETER | ABRASIVE GRAIN HARDNESS | OXIDATION-REDUCTION POTENTIAL Eh mV | pH | POLISHING RATE nm/h | SURFACE ROUGHNESS Ra nm |
| 31 | SILICA | 250nm | 680 | 1210 | 0.12 | 48 | 0.2 |
| 32 | SILICA | 250nm | 680 | 1403 | 0.34 | 250 | 0.1 |

FIG.7

METHOD FOR POLISHING GAN SINGLE CRYSTAL MATERIAL

TECHNICAL FIELD

The present invention relates to a polishing processing method for efficiently polishing a surface of a GaN single crystal material into a mirror surface.

BACKGROUND ART

Although electronic devices such as semiconductor integrated circuits are often constructed on silicon single crystal substrates, single crystal substrates made of gallium nitride GaN having better electric characteristics are expected to be used for power devices etc. requiring a function of controlling comparatively large electric power, instead of the silicon single crystal substrates. Since a power device using such a single crystal substrate made of gallium nitride GaN can deal with a large amount of electric power, generates small amount of heat, and can be miniaturized, the power device is preferably used as a control element controlling the number of rotations or torque of a motor or an electric generator in a hybrid vehicle, a fuel-cell vehicle, etc. The single crystal substrates made of gallium nitride GaN are excellent in high frequency characteristics and are expected to be developed into wireless communication stations, relay stations, mobile stations, etc.

In a typically employed manufacturing method employed for manufacturing of VLSI, a multiplicity of chips are formed on a semiconductor wafer, which is cut into respective chip sizes in a final process. Since a degree of integration is recently dramatically increased in association with improvements in VLSI manufacturing technology and wirings are increasingly multilayered, planarization of an entire semiconductor wafer (global planarization) is required in a process of forming each layer. One of the techniques of achieving such planarization of an entire semiconductor wafer is a polishing method referred to as a CMP (chemical mechanical polishing) method. In the CMP method, while a nonwoven fabric or a polishing pad such as a foam pad affixed to a surface plate is pressed against a wafer and forcibly rotated, a slurry (a dense suspension with fine powder dispersed in liquid such as an aqueous alkali solution) containing fine polishing particles (loose abrasive grains) is allowed to flow thereto for polishing. This CMP method achieves comparatively accurate polishing processing because of a synergetic effect between chemical polishing with a liquid component and mechanical polishing with polishing abrasive grains.

However, in such a conventional CMP method, a considerable time is spent for the polishing processing. If a loose abrasive grain polishing processing using diamond abrasive grains as polishing particles is performed, surface roughness becomes as large as Ra=10 nm, for example, although a certain level of processing efficiency is provided. In contrast, if a loose abrasive grain polishing processing is performed by using silica abrasive grains, the surface roughness becomes smaller; however, the processing efficiency deteriorates and scratches of unknown cause inconveniently tend to occur.

In this regard, a polishing processing method for polishing a SiC single crystal substrate is proposed. For example, this corresponds to a polishing processing method described in Patent Document 1.

PRIOR ART DOCUMENT

Patent Document

Patent Document 1: Japanese Laid-Open Patent Publication No. 2008-068390

SUMMARY OF THE INVENTION

Problem to Be Solved by the Invention

The polishing processing method of Patent Document 1 is based on finding of a specific polishing processing condition on which a high polishing efficiency is provided along with a low surface roughness of a SiC single crystal substrate with respect to ranges of hydrogen ion concentration pH and oxidation-reduction potential Eh of a polishing liquid. However, it is inappropriate to apply such a polishing processing condition directly to a single crystal substrate made of gallium nitride GaN, polishing processing of which is more difficult than the SiC single crystal substrate, and it is difficult to efficiently reduce the surface roughness of the single crystal substrate made of gallium nitride GaN.

The present invention was conceived in view of the situations and it is therefore an object of the present invention to provide a polishing processing method achieving sufficient polishing efficiency and polishing performance in polishing using a CMP method for a single crystal substrate made of gallium nitride GaN which is a material more difficult to process.

As a result of intensive continuous studies for developing such a method of polishing a material difficult to process by using a CMP method, the present inventors found out that, in a polishing processing method using a CMP method for polishing a surface of a crystal material to be smooth by using a polishing pad in the presence of a polishing liquid and polishing particles, polishing efficiency and polishing performance are made remarkably excellent for a single crystal substrate made of gallium nitride GaN which is the material difficult to process, by dissolving an oxidizing agent to impart oxidizability to the polishing liquid in specific regions existing respectively for a fixed polishing abrasive grain type polishing pad and a loose polishing abrasive grain type polishing pad with respect to ranges of oxidation-reduction potential Eh and pH of the polishing liquid. The present invention was conceived based on this knowledge.

Solution to Problem

That is, a first aspect of the invention provides a polishing processing method (a) using a CMP method for polishing a surface of a crystal material to be smooth by using a loose polishing abrasive grain type polishing pad in the presence of a polishing liquid and a plurality of polishing abrasive grains, wherein (b) the crystal material is a single crystal of GaN, and wherein (c) the polishing liquid is an oxidizing polishing liquid having an oxidation-reduction potential between Ehmin (determined by Eq. (1)) mV and Ehmax (determined by Eq. (2)) mV and pH between 0.1 and 6.5:

$$\text{Ehmin (mV)} = -33.9 \text{ pH} + 750 \tag{1}$$

$$\text{Ehmax (mV)} = -82.1 \text{ pH} + 1491 \tag{2}$$

That is, a second aspect of the invention provides a polishing processing method (d) using a CMP method for polishing a surface of a crystal material to be smooth by using a fixed polishing abrasive grain type polishing pad in the presence of a polishing liquid and a plurality of polishing abrasive grains, wherein (e) the crystal material is a single crystal of GaN, and wherein (f) the polishing liquid is an oxidizing polishing liquid having an oxidation-reduction potential between Ehmin (determined by Eq. (3)) mV and Ehmax (determined by Eq. (4)) mV and pH between 0.12 and 5.7:

$$Ehmin\ (mV) = -27.2\ pH + 738.4 \quad (3)$$

$$Ehmax\ (mV) = -84\ pH + 1481 \quad (4).$$

Advantageous Effects of Invention

According to the first aspect of the invention, in polishing processing using a CMP method, a loose polishing abrasive grain type polishing pad is used for polishing a surface of a crystal material that is a single crystal of GaN in the presence of an oxidizing polishing liquid having an oxidation-reduction potential between Ehmin (determined by Eq. (1)) [mV] and Ehmax (determined by Eq. (2)) [mV] and pH between 0.1 and 6.5, and therefore, a high polishing efficiency can preferably be provided while a low surface roughness is achieved.

According to the second aspect of the invention, in polishing processing using a CMP method, a fixed polishing abrasive grain type polishing pad is used for polishing a surface of a crystal material that is a single crystal of GaN in the presence of an oxidizing polishing liquid having an oxidation-reduction potential between Ehmin (determined by Eq. (3)) [mV] and Ehmax (determined by Eq. (4)) [mV] and pH between 0.12 and 5.7, and therefore, a high polishing efficiency can preferably be provided while a low surface roughness is achieved.

Preferably, the loose polishing abrasive grain type polishing pad is made of a hard polyurethane resin, and the polishing abrasive grains are loose abrasive grains contained in the polishing liquid supplied to the polishing pad. As a result, a higher polishing efficiency and a low surface roughness are provided, and a polishing accuracy is improved in terms of flatness etc.

Preferably, the oxidizing polishing liquid has potassium permanganate, potassium bichromate, or potassium thiosulphate added thereto as an oxidation-reduction potential adjustment agent. As a result, a preferable oxidizing polishing liquid is easily acquired.

Preferably, the fixed polishing abrasive grain type polishing pad has a matrix resin with independent pores or communicating pores, and the plurality of polishing abrasive grains is housed in the matrix resin such that the polishing abrasive grains are partially fixed inside the independent pores or communicating pores formed in the matrix resin or are partially separated from the matrix resin. As a result, since the polishing abrasive grains are contained in the communicating pores of the matrix resin, a higher polishing efficiency and a low surface roughness are provided. A consumed amount of the polishing abrasive grains is reduced, which enables the use of expensive polishing abrasive grains.

Preferably, the matrix resin of the fixed polishing abrasive grain type polishing pad is made of an epoxy resin or a polyethersulfone (PES) resin. As a result, a higher polishing effect is provided. However, for example, a synthetic resin etc. are also preferably used that include at least one of fluorine-based synthetic resins such as polyvinyl fluoride, vinyl fluoride-hexafluoropropylene copolymer, polyvinylidene fluoride, and vinylidene fluoride-hexafluoropropylene copolymer, polyethylene resins, and polymethylmethacrylate.

Preferably, the polishing abrasive grains contain at least one of diamond, CBN (cubic boron nitride), B4C (boron carbide), silicon carbide, silica, ceria, alumina, zirconia, titania, manganese oxide, barium carbonate, chromium oxide, and iron oxide. This advantageously enables the use of polishing abrasive grains with hardness corresponding to an object to be polished on which a favorable surface roughness can be achieved. Preferably, the polishing abrasive grains have the average grain diameter in a range of 0.005 to 10 (μm) and, in the case of silica, for example, fumed silica (silica microparticles acquired by high-temperature combustion of silicon tetrachloride, chlorosilane, etc. in the presence of hydrogen and oxygen) etc. are preferably used. Preferably, the volume percentage of the polishing abrasive grains to the polishing pad is within a range of 20 to 50(%) and the weight percentage thereof is within a range of 51 to 90(%).

Preferably, in the case of polishing using the fixed polishing abrasive grain type polishing pad, an amount of the polishing liquid is extremely small and is 0.1 to 200 ml/min/$m^2$ per unit area of a polishing surface plate. As a result, a higher polishing efficiency is provided, and a surface roughness is reduced.

MODE FOR CARRYING OUT THE INVENTION

An application example of the present invention will now be described in detail with reference to the drawings.

Embodiment

Figure 1:
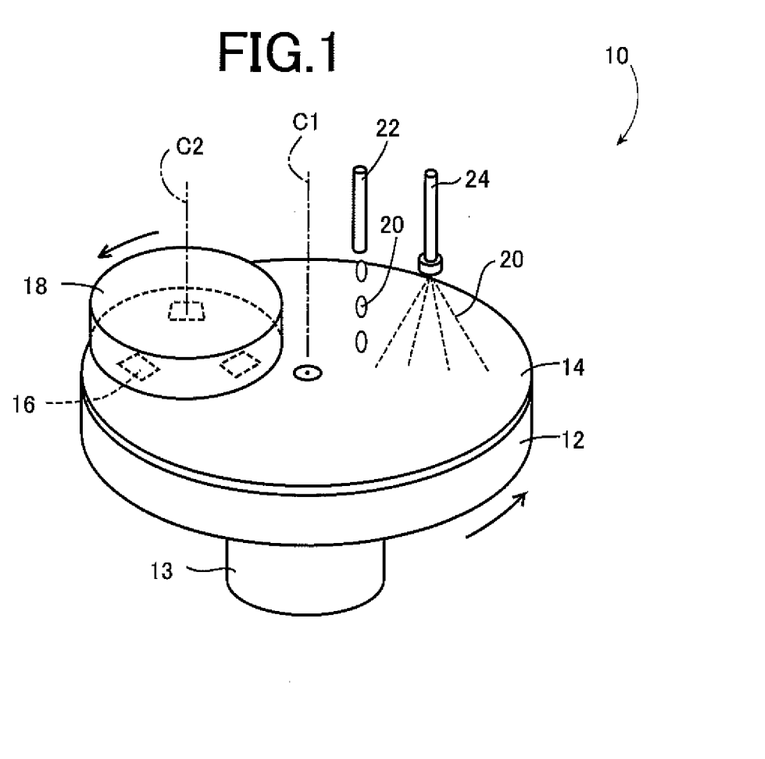
FIG. 1 is a conceptual perspective view of a configuration of a polishing processing apparatus implementing a polishing processing method of an application example of the present invention.

FIG. 1 conceptually shows a main portion of a polishing processing apparatus 10 for implementing polishing processing using a CMP (chemical mechanical polishing) method to which an example of the present invention is applied, with a frame removed. In FIG. 1, the polishing processing apparatus 10 is provided with a polishing surface plate 12 supported rotatably around a vertical axial center C1 of the polishing surface plate 12, and the polishing surface plate 12 is rotationally driven by a surface plate drive motor 13 in one rotation direction indicated by an arrow in FIG. 1. A polishing pad 14 is affixed to an upper surface of the polishing surface plate 12, i.e., a surface against which an object to be polished (GaN single crystal material) 16 is pressed. On the other hand, at a position eccentric from the axial center C1 on the polishing surface plate 12, a workpiece holding member (carrier) 18 holding the object to be polished 16 such as a GaN wafer on a lower surface by suction or by using a holding frame etc. is disposed and supported rotatably around an axial center C2 thereof and movably in an axial center C2 direction, and the workpiece holding member 18 is rotated in one rotation direction indicated by an arrow in FIG. 1 by a workpiece drive motor not shown or a rotational moment applied from the polishing surface plate 12. The object to be polished 16, i.e., a GaN single crystal substrate, is held on the lower surface of the workpiece holding member 18, i.e., a surface facing the polishing pad 14, and the object to be polished 16 is pressed against the polishing pad 14 at a predetermined load. A dropping nozzle 22 and/or a spray nozzle 24 is disposed in the vicinity of the workpiece holding member 18 of the polishing processing apparatus 10 to supply onto the polishing surface plate 12 a polishing liquid (lubricant) 20 that is an oxidizing aqueous solution delivered from a tank not shown.

The polishing processing apparatus 10 is provided as needed with an adjustment tool holding member not shown disposed rotatably around an axial center C3 parallel to the axial center C1 of the polishing surface plate 12 and movably in the direction of the axial center C3 and in the radial direction of the polishing surface plate 12 and a polishing object adjustment tool (conditioner) such as a diamond wheel not shown attached to a lower surface of the adjustment tool holding member, i.e., a surface facing the polishing pad 14, and the adjustment tool holding member and the polishing object adjustment tool attached thereto are pressed against the polishing pad 14 and reciprocated in the radial direction of the polishing surface plate 12 while being rotationally driven by an adjustment tool drive motor not shown, for adjustment of a polishing surface of the polishing pad 14, so that a surface state of the polishing pad 14 is always maintained in a state suitable for polishing processing.

In the polishing processing of the CMP method by the polishing processing apparatus 10, while the polishing surface plate 12 and the polishing pad 14 affixed thereto as well as the workpiece holding member 18 and the object to be polished 16 held on the lower surface thereof are rotationally driven around respective axial centers by the surface plate drive motor 13 and the workpiece drive motor, the polishing liquid 20 is supplied from the dropping nozzle 22 and/or the spray nozzle 24 onto the surface of the polishing pad 14, and the object to be polished 16 held by the workpiece holding member 18 is pressed against the polishing pad 14. As a result, a surface to be polished of the object to be polished 16, i.e., a surface facing the polishing pad 14 is polished to be flat by a chemical polishing action due to the polishing liquid 20 and a mechanical polishing action due to polishing abrasive grains 26 contained in the polishing pad 14 and self-supplied from the polishing pad 14. For example, silica with an average grain diameter of about 80 nm is used for the polishing abrasive grains 26.

Figure 2:
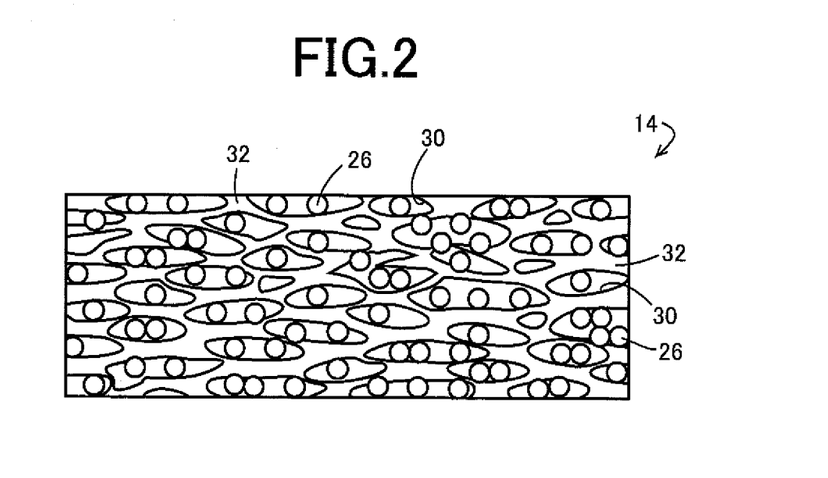
FIG. 2 is a schematic of a surface structure of the polishing pad shown in FIG. 1 magnified by a scanning electron microscope.

The polishing pad 14 affixed onto the polishing surface plate 12 is a loose polishing abrasive grain type polishing pad made of a hard foamed polyurethane resin or a fixed polishing abrasive grain type polishing pad made of an epoxy resin or a PES resin having independent pores or communicating pores housing the polishing abrasive grains 26 and has dimensions of about 300 (mmø)×5 (mm), for example. FIG. 2 shows an example of the fixed polishing abrasive grain type (polishing abrasive grain containing type) polishing pad, and the polishing pad is formed into a disk shape and includes a matrix resin 32 having communicating pores 30 and a multiplicity of the polishing abrasive grains 26 filled into the communicating pores 30 of the matrix resin 32 such that the grains are partially fixed to the matrix resin 32 or partially separated from the matrix resin 32. This fixed polishing abrasive grain type (polishing abrasive grain containing type) polishing pad is made of, for example, about 32 vol. % of the polishing abrasive grains 26, about 33 vol. % of the matrix resin 32, and the communicating pores 30 occupying the residual volume. FIG. 2 is a schematic of a structure of the polishing pad 14 magnified by a scanning electron microscope, and the communicating pores 30 of the matrix resin 32 formed sponge-like or mesh-like are formed into a size equivalent to or greater than that of the polishing abrasive grains 26 so that the multiplicity of the polishing abrasive grains 26 is held inside the communicating pores 30. The matrix resin 32 and the polishing abrasive grains 26 are fixed to each other by a necessary and sufficient binding force. The polishing pad 14 of this embodiment enables the polishing processing using a CMP method by supplying the polishing liquid 20 not containing loose abrasive grains, without using a slurry containing colloidal silica, for example.

In the polishing processing in the polishing processing apparatus 10 configured as described above, while the polishing surface plate 12 and the polishing pad 14 affixed thereto as well as the workpiece holding member 18 and the object to be polished 16 held on the lower surface thereof are rotationally driven around the respective axial centers by the surface plate drive motor 13 and the workpiece drive motor not shown, for example, the oxidizing polishing liquid 20 such as a potassium permanganate aqueous solution is supplied from the dropping nozzle 22 onto the surface of the polishing pad 14, and the object to be polished 16 held by the workpiece holding member 18 is pressed against the surface of the polishing pad 14. As a result, the surface to be polished of the object to be polished 16, i.e., the facing surface contacting with the polishing pad 14, is polished to be flat by the chemical polishing action due to the polishing liquid 20 and the mechanical polishing action due to the polishing abrasive grains 26 self-supplied from the polishing pad 14.

Experimental Example 1

An experimental example 1 performed by the present inventors will hereinafter be described. First, an apparatus having the same configuration as the polishing processing apparatus 10 shown in FIG. 1 was used for performing respective polishing tests of samples 1 to 14 that are GaN single crystal plates of 10 mm×10 mm×0.35 mm under the loose abrasive grain polishing conditions described below by using a loose polishing abrasive grain type polishing pad made of hard polyurethane and polishing abrasive grains, with respect to 14 oxidizing polishing liquids that are different from each other in pH and oxidation-reduction potential Eh adjusted with potassium permanganate and potassium thiosulphate for the oxidation-reduction potential and with sulfuric acid and potassium hydroxide for pH and that have the polishing abrasive grains dispersed at 12.5 wt. %.

[Loose Abrasive Grain Polishing Conditions]
Polishing processing apparatus: Engis Hyprez EJW-380
Polishing pad: hard foamed polyurethane, 300 mmø×2 mmt (IC 1000 manufactured by Nitta Haas)
Number of rotations of polishing pad: 60 rpm
Object to be polished (sample): GaN single crystal plate (0001)
Shape of object to be polished: three plates of 10 mm×10 mm×0.35 mm
Number of rotations of object to be polished: 60 rpm
Polishing load (pressure): 52.2 kPa
Polishing liquid supply amount: 10 ml/min
Polishing time: 120 min
Conditioner: SD#325 (electrodeposition diamond wheel)

Figure 3:
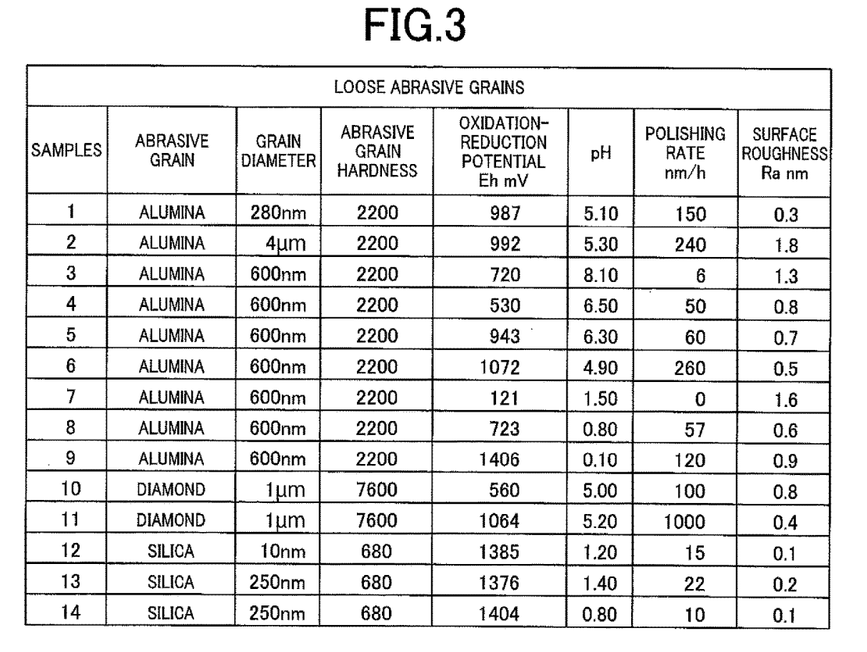
FIG. 3 is a chart of abrasive grains, abrasive grain diameters, abrasive grain hardness (Knoop hardness), oxidation-reduction potential and pH of polishing liquid used in polishing of samples 1 to 14, as well as respective acquired values of polishing rate PR (nm/h) and surface roughness Ra in experimental example 1.

FIG. 3 shows types of abrasive grains, average diameters (nm) of abrasive grains, abrasive grain hardness (Knoop hardness), oxidation-reduction potential Eh (hydrogen electrode reference potential) and hydrogen ion concentration pH of polishing liquid used for the samples 1 to 14, as well as polishing results, i.e., polishing rates PR (nm/h) and surface roughness Ra (nm). Among these samples 1 to 14, preferable polishing results were acquired from the samples 1, 2, 4 to 6, and 8 to 14 providing the polished surfaces with the surface roughness Ra of 2.3 nm or less and the polishing rates of 7 nm/h or more.

Figure 4:
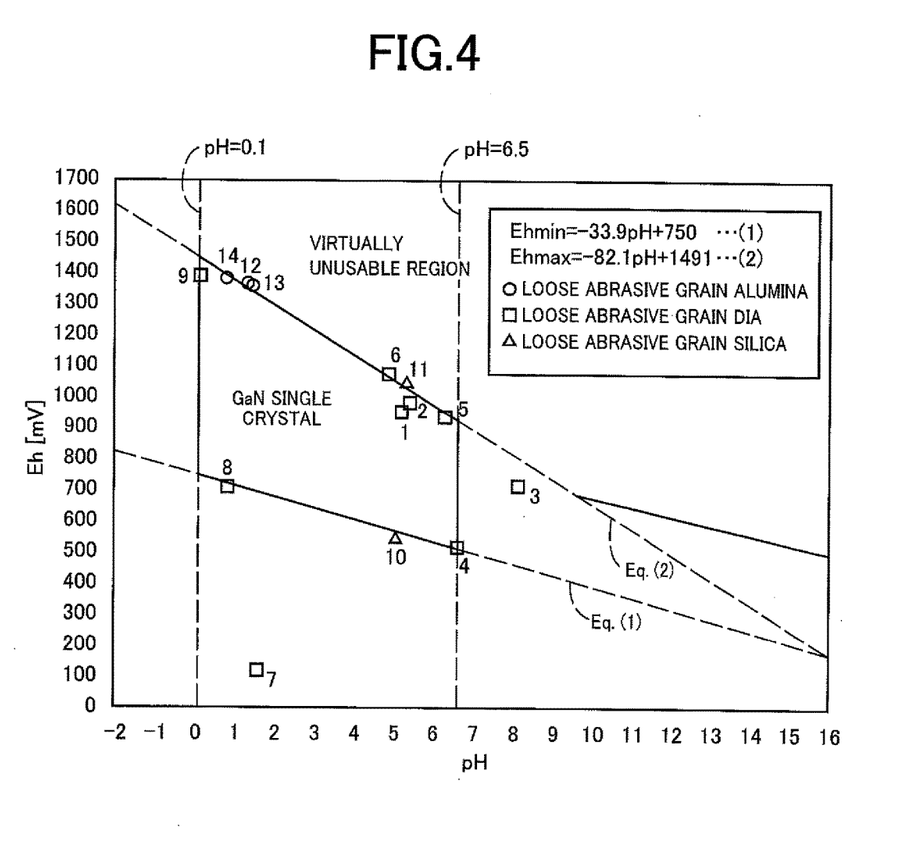
FIG. 4 is a diagram of two-dimensional coordinates acquired by plotting the oxidation-reduction potential and pH of polishing liquid in the polishing of samples 1 to 14 of FIG. 3 and representative of a region in which favorable polishing is provided.

FIG. 4 shows a region of the oxidation-reduction potential Eh (hydrogen electrode reference potential) and the hydrogen ion concentration pH of the polishing liquid used for the samples 1, 2, 4 to 6, and 8 to 14 from which the preferable results were acquired, in two-dimensional coordinates representative of the oxidation-reduction potential Eh (hydrogen electrode reference potential) and the hydrogen ion concentration pH of the polishing liquid. This region is identified by the oxidation-reduction potential within a range from Ehmin (a value is determined by Eq. (1)) [mV] to Ehmax (a value is determined by Eq. (2)) [mV] and pH within a range of 0.1 to 6.5. Eq. (1) is represented by a straight line connecting a point indicative of the sample 4 and a point indicative of the sample 8, and Eq. (2) is represented by a straight line connecting a point indicative of the sample 11 and a point indicative of the sample 13.

$$Ehmin\ (mV) = -33.9\ pH + 750 \tag{1}$$

$$Ehmax\ (mV) = -82.1\ pH + 1491 \tag{2}$$

Experimental Example 2

An experimental example 2 performed by the present inventors will hereinafter be described. First, an apparatus having the same configuration as the polishing processing apparatus 10 shown in FIG. 1 was used for performing respective polishing tests of samples 15 to 30 that are GaN single crystal plates of 10 mm×10 mm×0.35 mm under the fixed abrasive grain polishing conditions described below by using an abrasive grain containing polishing pad, with respect to 16 oxidizing polishing liquids different from each other in pH and oxidation-reduction potential Eh adjusted with potassium permanganate and potassium thiosulphate for the oxidation-reduction potential and with sulfuric acid and potassium hydroxide for pH. In this processing, the abrasive grain containing polishing pad used for the samples 15 to 30 includes a matrix resin having independent pores and polishing abrasive grains housed in the independent pores such that the grains are partially fixed to the matrix resin or partially separated from the matrix resin, and is made of, for example, 10 vol. % of silica ($\rho$=2.20) or alumina ($\rho$=3.98), 55 vol. % of an epoxy resin ($\rho$=1.15) serving as the matrix resin, and 35 vol. % of the independent pores. The abrasive grain containing polishing pad used for the samples 31 to 32 includes a matrix resin having communicating pores and polishing abrasive grains housed in the matrix resin, and is made of, for example, 32 vol. % of silica ($\rho$=2.20), 33 vol. % of a polyethersulfone (PES) resin ($\rho$=1.35) serving as the matrix resin, and 35 vol. % of the communicating pores. The abrasive grain containing polishing pad is formed into a sheet shape of 500×500×2 mm and cut out into a circular shape of 300 mmø, for example.

[Fixed Abrasive Grain Polishing Conditions]
Polishing processing apparatus: Engis Hyprez EJW-380
Polishing pad: abrasive-grain-containing polishing pad, 300 mmø×2 mmt
Number of rotations of polishing pad: 60 rpm
Object to be polished (sample): GaN single crystal plate (0001)
Shape of object to be polished: three plates of 10 mm×10 mm×0.35 mm
Number of rotations of object to be polished: 60 rpm
Polishing load (pressure): 52.2 kPa
Polishing liquid supply amount: 10 ml/min
Polishing time: 120 min
Conditioner: SD#325 (electrodeposition diamond wheel)

Figure 5:
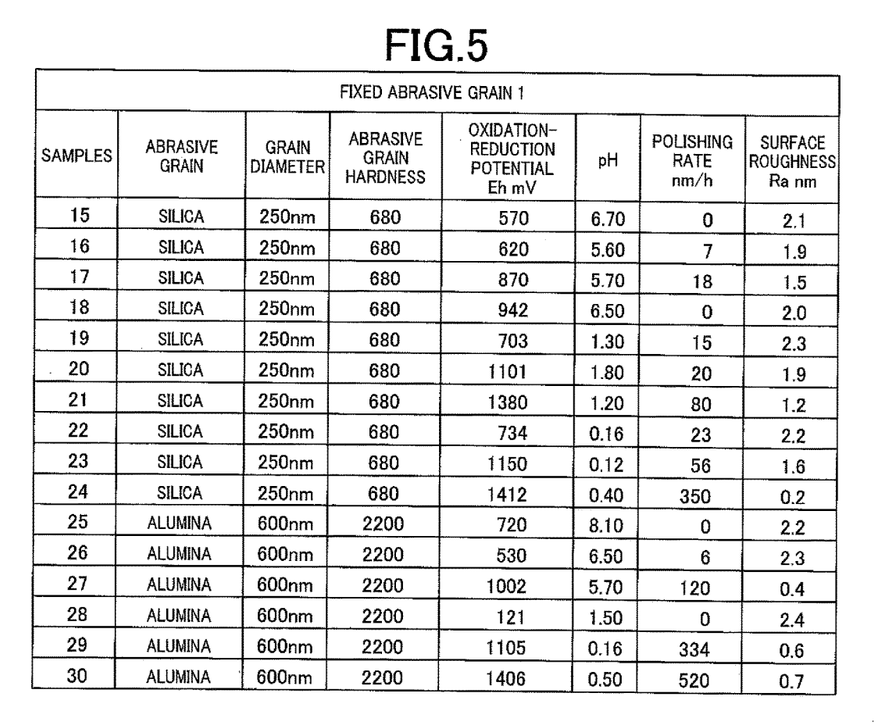
FIG. 5 is a chart of abrasive grains, abrasive grain diameters, abrasive grain hardness (Knoop hardness), oxidation-reduction potential and pH of polishing liquid used in polishing of samples 15 to 30, as well as respective acquired values of polishing rate PR (nm/h) and surface roughness Ra in experimental example 2.
Figure 6:
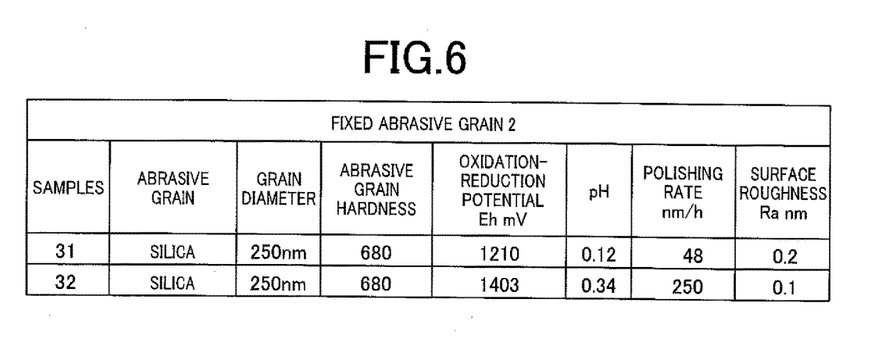
FIG. 6 is a chart of abrasive grains, abrasive grain diameters, abrasive grain hardness (Knoop hardness), oxidation-reduction potential and pH of polishing liquid used in polishing of samples 31 and 32, as well as respective acquired values of polishing rate PR (nm/h) and surface roughness Ra in experimental example 2.

FIGS. 5 and 6 show types of abrasive grains, average diameters (nm) of abrasive grains, abrasive grain hardness (Knoop hardness), oxidation-reduction potential Eh (hydrogen electrode reference potential) and hydrogen ion concentration pH of polishing liquid used for the samples 15 to 32, as well as polishing results, i.e., polishing rates PR (nm/h) and surface roughness Ra (nm). Among these samples 15 to 32, preferable polishing results were acquired from the samples 16, 17, 19 to 24, 27, and 29 to 32 providing the polished surfaces with the surface roughness Ra of 2.3 nm or less and the polishing rates of 7 nm/h or more.

Figure 7:
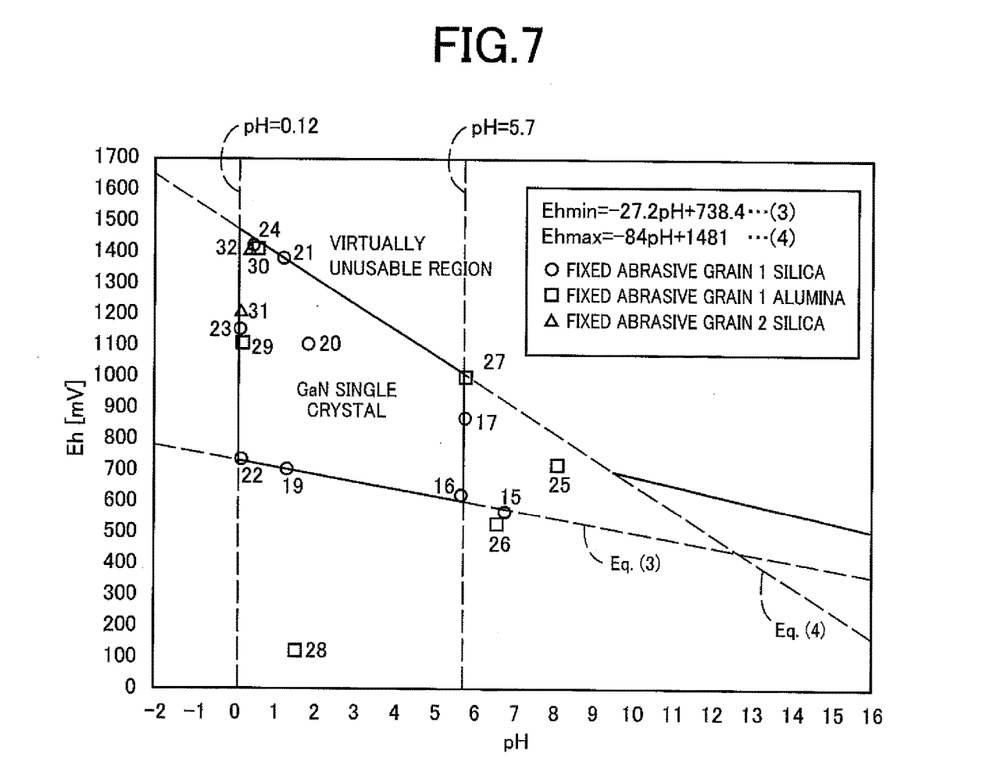
FIG. 7 is a diagram of two-dimensional coordinates acquired by plotting the oxidation-reduction potential and pH of polishing liquid in the polishing of samples 15 to 32 of FIGS. 5 and 6, and representative of a region in which favorable polishing is provided.

FIG. 7 shows a region of the oxidation-reduction potential Eh (hydrogen electrode reference potential) and the hydrogen ion concentration pH of the polishing liquid used for the samples 16, 17, 19 to 24, 27, and 29 to 32 from which the preferable results were acquired, in two-dimensional coordinates representative of the oxidation-reduction potential Eh (hydrogen electrode reference potential) and the hydrogen ion concentration pH of the polishing liquid. This region is identified by the oxidation-reduction potential within a range from Ehmin (a value is determined by Eq. (3)) [mV] to Ehmax (a value is determined by Eq. (4)) [mV] and pH within a range of 0.12 to 5.7. Eq. (3) is represented by a straight line connecting a point indicative of the sample 19 and a point indicative of the sample 22, and Eq. (4) is represented by a straight line connecting a point indicative of the sample 21 and a point indicative of the sample 27.

$$Ehmin\ (mV) = -27.2\ pH + 738.4 \tag{3}$$

$$Ehmax\ (mV) = -84\ pH + 1481 \tag{4}$$

Although not exemplarily illustrated one by one, the present invention is used with other various modifications without departing from the spirit thereof.

REFERENCE SIGNS LIST

10: Polishing processing apparatus
12: Polishing surface plate

14: Polishing pad (Loose polishing abrasive grain type polishing pad, Fixed polishing abrasive grain type polishing pad)
16: Object to be polished (GaN single crystal material)
20: Polishing liquid
26: Polishing abrasive grains
30: Communicating pores
32: Matrix resin

The invention claimed is:

1. A polishing processing method using a CMP method for polishing a surface of a crystal material to be smooth by using a loose polishing abrasive grain type polishing pad in the presence of a polishing liquid and a plurality of polishing abrasive grains, wherein
the crystal material is a single crystal of GaN, and wherein
the polishing liquid is an oxidizing polishing liquid having an oxidation-reduction potential between Ehmin (determined by Eq. (1)) mV and Ehmax (determined by Eq. (2)) mV and pH within a range of 0.1 to 1.5 and 4.9 to 6.5:

$$Ehmin\ (mV) = -33.9\ pH + 750 \qquad (1)$$

$$Ehmax\ (mV) = -82.1\ pH + 1491 \qquad (2).$$

2. The polishing processing method according to claim 1, wherein the oxidizing polishing liquid has potassium permanganate or potassium thiosulphate added thereto as an oxidation-reduction potential adjustment agent.

3. The polishing processing method according to claim 1, wherein
the loose polishing abrasive grain type polishing pad is made of a hard foamed polyurethane resin, and wherein
the polishing abrasive grans are loose abrasive grains contained in the oxidizing polishing liquid supplied to the polishing pad.

4. The polishing processing method according to claim 1, wherein the pH of the oxidizing polishing liquid is within a range of 0.1 to 1.2 and 6.3 to 6.5.

5. A polishing processing method using a CMP method for polishing a surface of a crystal material to be smooth by using a fixed polishing abrasive grain type polishing pad in the presence of a polishing liquid and a plurality of polishing abrasive grains, wherein
the crystal material is a single crystal of GaN, and wherein
the polishing liquid is an oxidizing polishing liquid having an oxidation-reduction potential between Ehmin (determined by Eq. (3)) mV and Ehmax (determined by Eq. (4)) mV and pH between 0.12 and 5.7:

$$Ehmin\ (mV) = -27.2\ pH + 738.4 \qquad (3)$$

$$Ehmax\ (mV) = -84\ pH + 1481 \qquad (4).$$

6. The polishing processing method according to claim 5, wherein the oxidizing polishing liquid has potassium permanganate or potassium thiosulphate added thereto as an oxidation-reduction potential adjustment agent.

7. The polishing processing method according to claim 5, wherein
the fixed polishing abrasive grain type polishing pad has a matrix resin with independent pores or communicating pores, and wherein
the plurality of polishing abrasive grains is housed in the matrix resin such that the polishing abrasive grains are partially fixed inside the independent pores or communicating pores formed in the matrix resin or are partially separated from the matrix resin.

8. The polishing processing method according to claim 5, wherein a matrix resin of the fixed polishing abrasive grain type polishing pad is made of an epoxy resin or a polyethersulfone (PES) resin.

9. The polishing processing method according to claim 5, wherein the oxidizing polishing liquid does not contain loose abrasive grains.

* * * * *